United States Patent
Liaw et al.

(10) Patent No.: US 9,341,322 B2
(45) Date of Patent: May 17, 2016

(54) COLOR-MIXING LIGHT-EMITTING DIODE MODULE

(71) Applicant: BRIGHT LED ELECTRONICS CORP., New Taipei (TW)

(72) Inventors: Tsung-Jen Liaw, New Taipei (TW); Jen-Te Chen, New Taipei (TW); Ting-Yuan Cheng, New Taipei (TW)

(73) Assignee: Bright LED Electronics Corp., New Taipei (TW)

( * ) Notice: Subject to any disclaimer, the term of this patent is extended or adjusted under 35 U.S.C. 154(b) by 197 days.

(21) Appl. No.: 14/273,712

(22) Filed: May 9, 2014

(65) Prior Publication Data
US 2015/0260357 A1   Sep. 17, 2015

(30) Foreign Application Priority Data
Mar. 11, 2014 (TW) .............................. 103108523 A

(51) Int. Cl.
| | |
|---|---|
| *F21K 99/00* | (2010.01) |
| *H01L 25/075* | (2006.01) |
| *F21Y 113/00* | (2016.01) |
| *H01L 33/50* | (2010.01) |
| *H01L 33/58* | (2010.01) |

(52) U.S. Cl.
CPC .............. *F21K 9/54* (2013.01); *H01L 25/0753* (2013.01); *F21Y 2113/007* (2013.01); *H01L 33/504* (2013.01); *H01L 33/58* (2013.01); *H01L 2224/48091* (2013.01); *H01L 2924/15192* (2013.01); *H01L 2924/181* (2013.01)

(58) Field of Classification Search
CPC .... F21Y 2113/007; F21K 9/54; H01L 33/504
See application file for complete search history.

(56) References Cited

U.S. PATENT DOCUMENTS

| | | | | |
|---|---|---|---|---|
| 8,760,049 B2* | 6/2014 | Cha | ..................... | H01L 25/0753 313/512 |
| 2004/0217364 A1* | 11/2004 | Tarsa | .................. | H01L 25/0753 257/89 |
| 2009/0108271 A1* | 4/2009 | Chou | .................. | H01L 25/0753 257/88 |
| 2010/0090231 A1* | 4/2010 | Jung | ................... | H01L 25/0753 257/89 |

\* cited by examiner

*Primary Examiner* — Elmito Breval
(74) *Attorney, Agent, or Firm* — Rosenberg, Klein & Lee

(57) ABSTRACT

The present invention provides a color-mixing light-emitting diode module. According to the present invention, a first light-emitting chip and two second light-emitting chips are disposed on a holder. The first light-emitting chip emits red light and the plurality of second light-emitting chips emit white light. The red light and the white light are mixed, giving mixed light with high color rendering and brightness. Objects illuminated by the mixed light will exhibit colors closest to their original colors as perceived by eyes. Furthermore, by arranging the first and second light-emitting chips in matrix, the color rendering of the light-emitting diode module can be adjusted and improved.

16 Claims, 5 Drawing Sheets

COLOR-MIXING LIGHT-EMITTING DIODE MODULE

FIELD OF THE INVENTION

The present invention relates generally to a light-emitting diode (LED) module, and particularly to a color-mixing LED module.

BACKGROUND OF THE INVENTION

Technologies progress with each passing day. In the lighting technology, the advancement is especially significant. The LED technology has been developing actively in recent years. The emittable light spans visible light, infrared light, and ultraviolet light; the light intensity is also raised substantially. With the emergence of white LEDs, the development is gradually directed to lighting applications nowadays.

An LED is monochromatic light source. On the other hand, the white light (the sunlight) in the nature has a wide-band spectrum. Thereby, a single LED cannot emit light with multiple colors; other materials should be used as auxiliaries. In other words, it is impossible that a single LED emits white light. Instead, a white LED is formed by the monochromatic light composed of three primary colors, namely, red (R), green (G), and blue (B), or by converting the monochromatic light emitted by an LED into white light by using fluorescent powders. Then, the overall spectrum contains the spectra of the three primary colors, which stimulate the light sensing cell in human eyes and thus eliciting the sense of white light.

All of the popular white LEDs adopt a single light-emitting unit to emit light with shorter wavelength, such as blue or ultraviolet light. Then, by using phosphor, a portion or all of the light is converted to the light containing green and red light, which have longer wavelengths in spectrum. The conversion of wavelength of light is named fluorescence. Its principle is that after short-wavelengths photons (blue, violet, and ultraviolet light) are absorbed by electrons in the fluorescent material, the electrons are excited to a high-energy-level and unstable excited state. Afterwards, when the electrons return to the original levels, a part of the energy is dissipated in the form of heat, while the rest is released in the form of photons. Because the energy of the released photons is less than before, their wavelengths will be longer. In addition, during the conversion process, a portion of energy is converted to heat, which is energy loss. Thereby, the efficiency of such kind of white LEDs is lower.

Besides, although the current LED technology is advancing continuously, there are still many drawbacks. High-efficient LED chips are power consuming and elicit high temperature, resulting in waste of power as well as shortening in lifetime. Hence, improvements are required in heat dissipation and color rendering. Traditional bulbs and halogen lamps have superior color rendering; fluorescent tubes also have high color rendering. Illumination by light sources with low color rendering results in an abnormal feel of color. Moreover, it also harms vision and health.

Technical research and development are devoted to reinforcing color rendering. It is generally believed that artificial light sources should enable human eyes to percept colors with correctness, just as seeing objects in the sunlight. Thereby, good color rendering means closer to the real look of objects in the sunlight, while bad color rendering means distortion. If the colors seen in a certain light source are utterly identical to those seen in standard illumination, the general color rendering index (Ra) is defined as 100. Basically, values of the general color rendering index greater than Ra80 will satisfy higher lighting requirements for color visibility. Of course, depending on application scenes and purposes, the requirements can be different. This gauge is the color-rendering property of a light source and named as the general color rendering index. The general color rendering index is the difference between the colors of an object illuminated by a certain light source and a reference light source.

The present invention improves the drawbacks according to the prior art. According to the present invention, a first light-emitting chip and two second light-emitting chips are disposed on a holder for die bonding and wire bonding. The first light-emitting chip emits red light and the plurality of second light-emitting chips emit white light. The red light and the white light are mixed, giving a mixed light with high color rendering and brightness. Objects illuminated by the mixed light will exhibit colors closest to their original colors as perceived by eyes.

SUMMARY

In the structure of the light-source module in current LEDs, because the light emitted by the red LED chip will illuminate the green fluorescent powder inside the cover layer, the red light emitted by the red LED chip will be absorbed and sheltered by the green powder, leading to attenuation in intensity and hue. Consequently, the white light source generated by the light-source module of the LED cannot have good color rendering and brightness concurrently; the light-source module of the LED will be inferior in color rendering or brightness. Accordingly, an objective of the present invention is to provide a color-mixing LED module, which can maintain the intensity and hue of red light for enhancing color rendering and brightness of the mixed light source. Hence, the object of improving color rendering and brightness of the present invention can be achieved.

In order to achieve the main objective and effect described above, the present invention provides a color-mixing LED module, which mainly comprises a holder, a frame member, at least a first light-emitting chip, and at least two second light-emitting chips. The frame member is disposed on the holder and includes at least a frame for partitioning into a first accommodating space and two accommodating spaces. The first light-emitting chip is bonded in the first accommodating space and emits light with wavelength ranging from 590 nm to 700 nm. A piece of first sealing glue covers the light-emitting path of the first light-emitting chip. In addition, the plurality of second light-emitting chips are disposed on one side of the first light-emitting chip and bonded in the plurality of second accommodating spaces. A piece of second sealing glue covers the light-emitting path of the second light-emitting chips and contains red fluorescent powder. Besides, the first light-emitting chip and the plurality of second light-emitting chips are disposed on the holder in a one-to-two matrix.

Furthermore, the frame member is disposed on the holder and includes at least a frame for partitioning into a first accommodating space and two accommodating spaces. The first light-emitting chip is bonded in the first accommodating space and emits light with wavelength ranging from 590 nm to 700 nm. A piece of first sealing glue covers the light-emitting path of the first light-emitting chip. In addition, the plurality of second light-emitting chips are disposed on one side of the first light-emitting chip and bonded in the plurality of second accommodating spaces. A piece of second sealing glue covers the light-emitting path of the second light-emitting chips and contains red fluorescent powder and green fluorescent powder with a ratio between 1:2 and 1:50.

DETAILED DESCRIPTION

In order to make the structure and characteristics as well as the effectiveness of the present invention to be further understood and recognized, the detailed description of the present invention is provided as follows along with embodiments and accompanying figures.

The present invention solves the drawback of inferior color rendering in the light emitted by LEDs according to the prior art by providing a color-mixing LED module, The main characteristic of the present invention is producing a mixed light with high color rendering. When the mixed light illuminates an object, the object will exhibit more realistic colors in human eyes.

Figure 1:
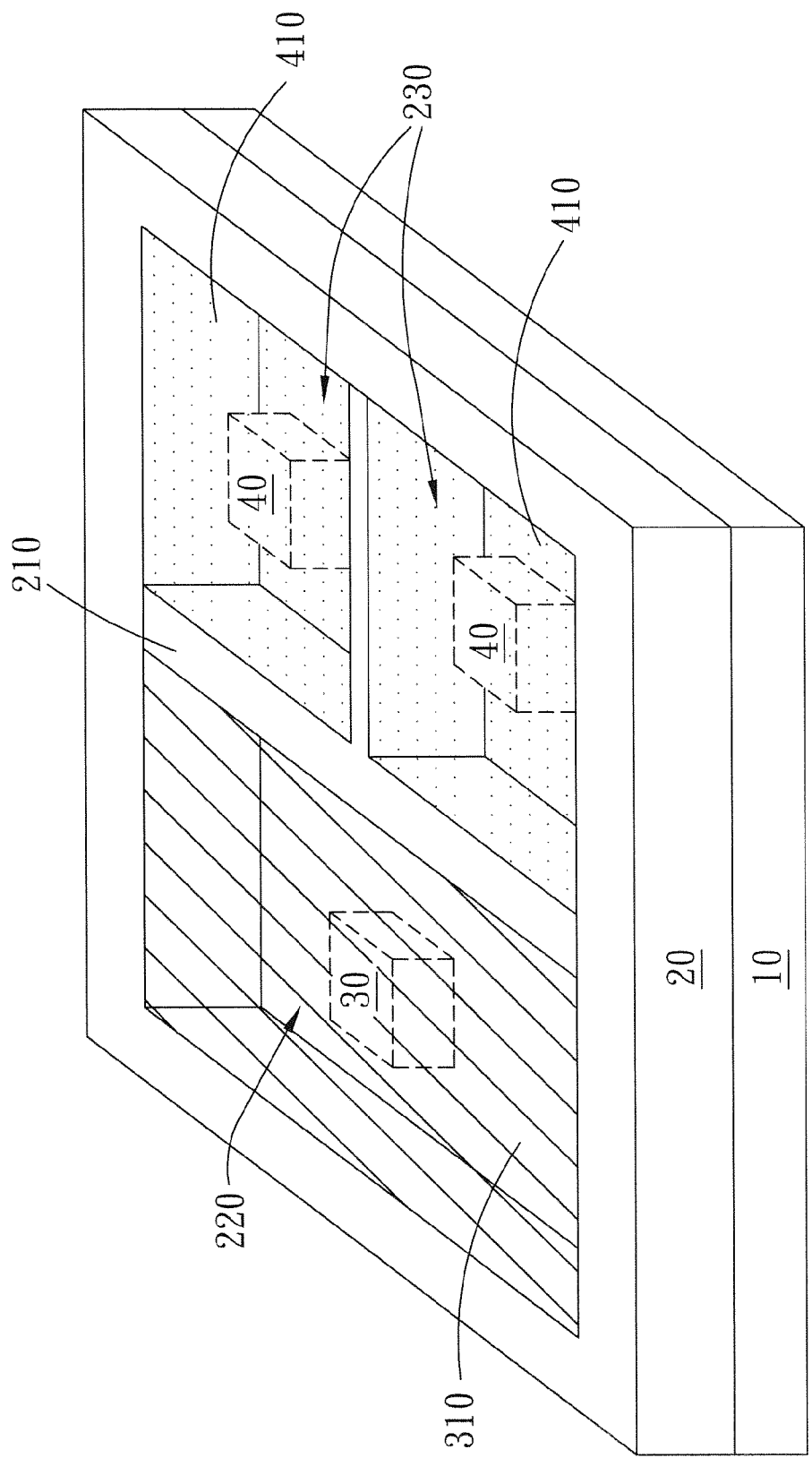
FIG. 1 shows a three-dimensional structural diagram of the color-mixing LED module according to the first embodiment of the present invention.

Please refer to FIG. 1, which shows a three-dimensional structural diagram of the color-mixing LED module according to the first embodiment of the present invention. As shown in the figure, the color-mixing LED module according to the present invention mainly comprises a holder 10, a frame member 20, at least a first light-emitting chip 30, and at least two second light-emitting chips 40.

The frame member 20 is disposed on the holder 10 and includes at least a frame 210 for partitioning into a first accommodating space 220 and two accommodating spaces 230. The first light-emitting chip 30 is bonded in the first accommodating space 220 and emits light with wavelength ranging from 590 nm to 700 nm. A piece of first sealing glue 310 covers the light-emitting path of the first light-emitting chip 30. In addition, the plurality of second light-emitting chips 40 are disposed on one side of the first light-emitting chip 30 and bonded in the plurality of second accommodating spaces 230. A piece of second sealing glue 410 covers the light-emitting path of the second light-emitting chip 40 and contains red fluorescent powder. Besides, the first light-emitting chip 30 and the plurality of second light-emitting chips 40 are disposed on the holder 10 in a one-to-two matrix.

Moreover, when the second light-emitting chips 40 emit blue light with wavelength ranging between 380 nm and 500 nm, the second sealing glue 410 further includes green fluorescent powder or yellow fluorescent powder. As the blue light passes through the second sealing glue 410, white light is generated. The preferable wavelength of the blue light is between 450 nm and 500 nm. When the second light-emitting chips 40 emit ultraviolet (UV) light, the second sealing glue 410 further includes green fluorescent powder and blue fluorescent powder. As the UV light passes through the second sealing glue 410, which contains red, green, and blue fluorescent powder, white light is generated. The UV light can be divided into three segments. UV-A includes wavelengths between 400 nm and 315 nm; UV-B includes wavelengths between 280 nm and 315 nm; and UV-C includes wavelengths between 200 nm and 280 nm. All these three segments can be used. By using the above structure, the light emitted by the second light-emitting chips 40 passes through the second sealing glue 410 and thus generating white light. There are many ways to emit white light. Several methods have been proposed in the above description. Nonetheless, the technology of emitting white light is not main technical characteristic of the present invention. Hence, the details will not be described. The white light described above further accompanies light emitting of the first light-emitting chip 30. The first light-emitting chip 30 emits red light with a wavelength between 590 nm and 700 nm. The preferable wavelength of the red light is between 610 nm and 700 nm. By using the red light emitted by the first light-emitting chip 30 and the converted red light by the red fluorescent powder provided in the second sealing glue 410, the purpose of improving color rendering and brightness of the mixed light can be achieved.

Figure 2:
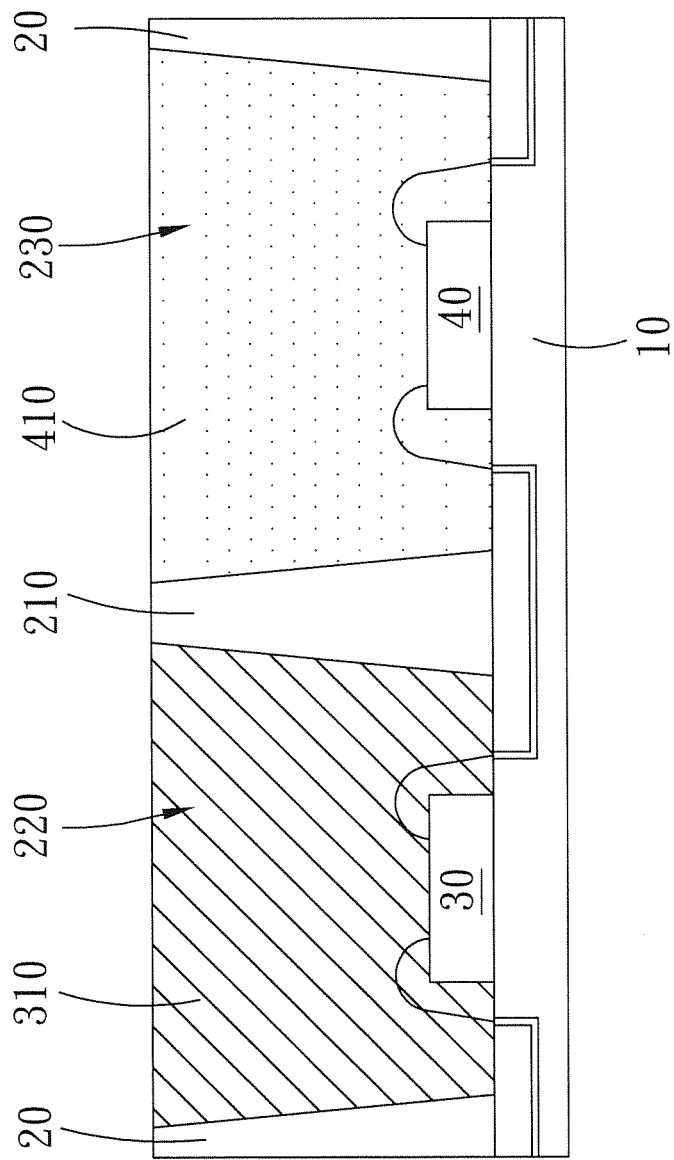
FIG. 2 shows a cross-sectional structural diagram of the color-mixing LED module according to the second embodiment of the present invention.

Please refer to FIG. 2, which shows a cross-sectional structural diagram of the color-mixing LED module according to the second embodiment of the present invention. As shown in the figure, likewise, according to the second embodiment of the present invention, the frame member 20 is disposed on the holder 10 and includes at least a frame 210 for partitioning into a first accommodating space 220 and two accommodating spaces 230. The first accommodating space 220 is the same as the one according to the first embodiment. In addition, the second light-emitting chips are bonded in the second accommodating spaces 230. The wavelength of the light emitted by the second light-emitting chips 40 ranges between 380 nm and 500 nm. A piece of second sealing glue 410 covers the light-emitting path of the second light-emitting chips 40 and contains red fluorescent powder and green fluorescent powder with a ratio between 1:2 and 1:50.

The same method as the first embodiment is used for bonding the second light-emitting chips 40 in the second accommodating spaces 230. The second light-emitting chips 40 can emit blue or UV light. When the second light-emitting chips 40 emit blue light with a wavelength between 380 nm and 500 nm, the ratio of the red fluorescent powder to the green fluorescent powder described above is between 1:2 and 1:50. Preferably, the wavelength of the blue light is between 450 nm and 500 nm. When the second light-emitting chips 40 emit UV light, the second sealing glue 410 further includes blue fluorescent powder. The wavelength of the UV light is between 200 nm and 400 nm. By using the above structure, the light emitted by the second light-emitting chips 40 passes through the second sealing glue 410 and thus generating white light. The white light described above further accompanies light emitting of the first light-emitting chip 30. The first light-emitting chip 30 emits red light with a wavelength between 590 nm and 700 nm. The preferable wavelength of the red light is between 610 nm and 700 nm. The light emitted by the first light-emitting chip 30 is mixed with the light emitted by the second light-emitting chips 40 for enhancing color rendering and brightness. In addition, by adjusting the ratio between the red and green fluorescent powder described above, the color temperature can be adjusted accordingly.

The first light-emitting chip 30 and the plurality of second light-emitting chips 40 according to the present invention are disposed on the holder 10. The first light-emitting chip 30 and the plurality of second light-emitting chips 40 can be connected electrically using serial connection, parallel connection, or combination of serial and parallel connections, depending on the requirement of users.

Figure 3:
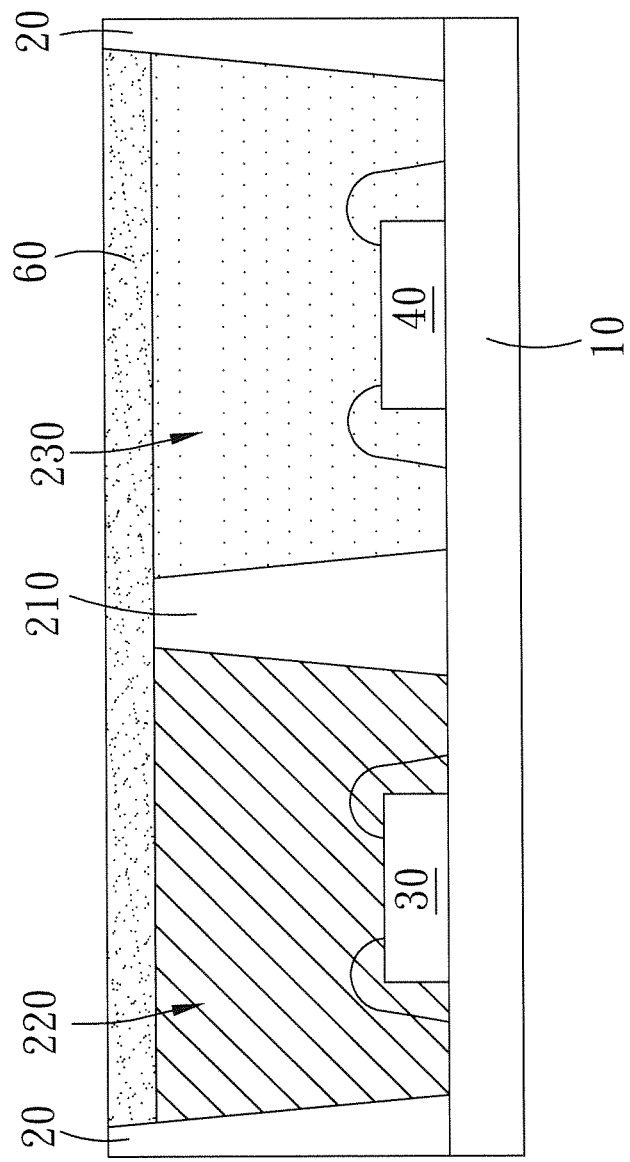
FIG. 3 shows a schematic diagram of the light homogenizer of the color-mixing LED module according to the third embodiment of the present invention.

Please refer to FIG. 3, which shows a schematic diagram of the light homogenizer of the color-mixing LED module according to the third embodiment of the present invention. As shown in the figure, the present invention makes use of the lower height of the frame 210 than the height of the frame member 20. Besides, a sealing layer 60 is disposed inside the frame member 20. The sealing layer 60 covers the first accommodating space 220, the plurality of the second accommodating spaces 230, and the frame 210. The number of refractions of the light emitted by the first light-emitting chip 30 and the plurality of second light-emitting chips 40 is increased by passing through the sealing layer 60, resulting in enhanced color uniformity. Thereby, the present invention provides the efficacy of improving color uniformity.

Figure 4:
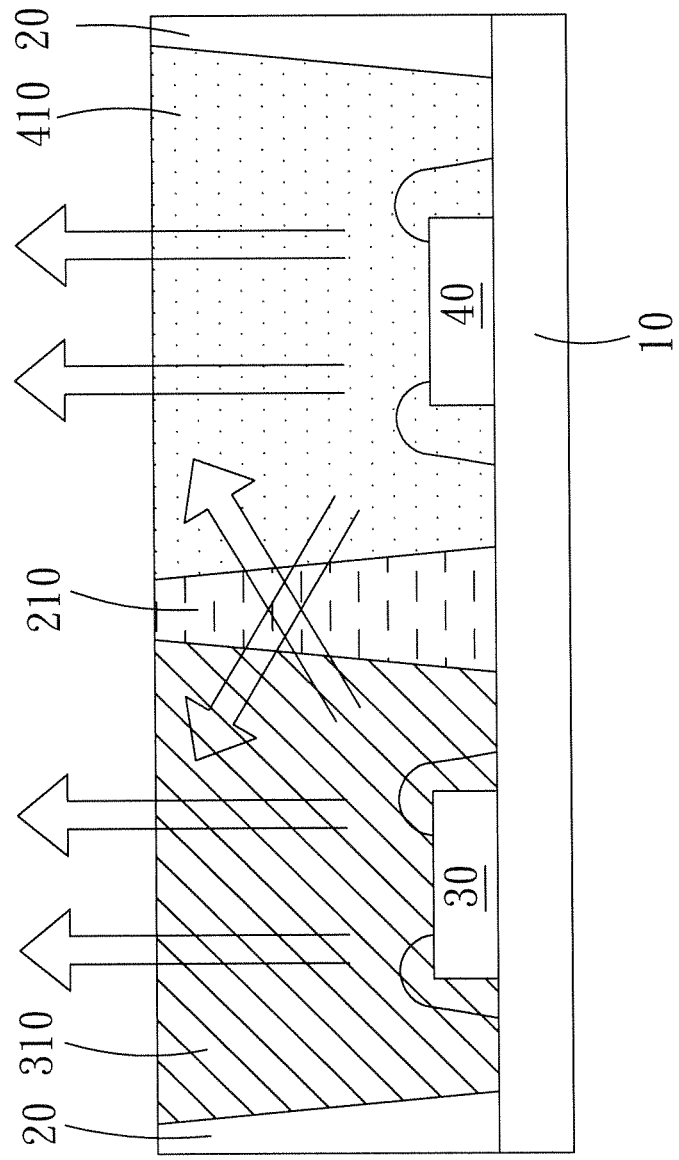
FIG. 4 shows a schematic diagram of the light guiding frame of the color-mixing LED module according to the fourth embodiment of the present invention.

Please refer to FIG. 4, which shows a schematic diagram of the light guiding frame of the color-mixing LED module according to the fourth embodiment of the present invention. As shown in the figure, the material of the frame 210 according to the present invention can be semi-transparent, represented in dashed lines. The semi-transparency here can be further defined as when the frame 210 is illuminated by light with a wavelength longer than 450 nm, the transmissivity of the frame 210 is above 80% and less than 100%. By using the semi-transparent frame 210, when the second light-emitting chip 40 emits blue light, the blue light passing through the second sealing glue 410, which contains mixture of red and green fluorescent powder, can be mixed with the red light emitted by the first light-emitting chip 30 via the frame 210. Thereby, the efficacy of uniformity and color mixing can be further enhanced.

Figure 5:
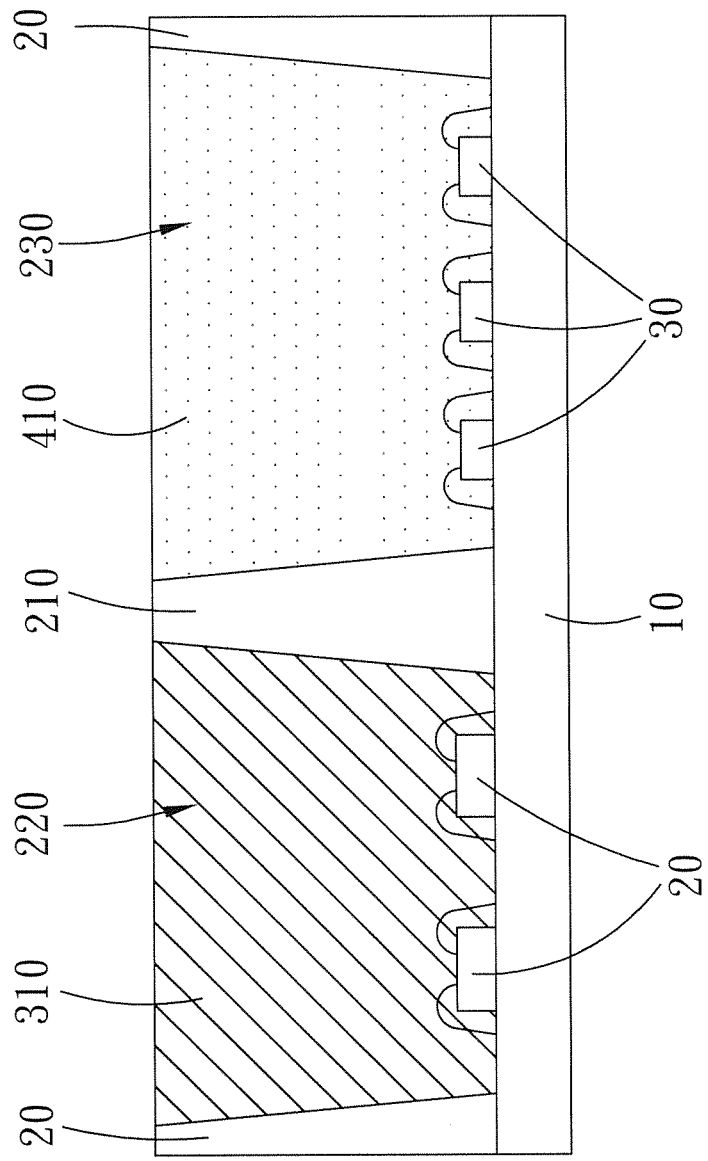
FIG. 5 shows a schematic diagram of multiple chips of the color-mixing LED module according to the fifth embodiment of the present invention.

Please refer to FIG. 5, which shows a schematic diagram of multiple chips of the color-mixing LED module according to the fifth embodiment of the present invention. As shown in the figure, the frame 210 is disposed on the holder 10 and partitions the frame 210 into at least a first accommodating space 220 and at least a second accommodating space 230. Thereby, the first accommodating space 220 can bond one or multiple first light-emitting chips 30 and the second accommodating space 230 can bond one or multiple second light-emitting chips 40 as well. Thus, the light-emitting intensity of the first and second light-emitting chips 30, 40 can be controlled, respectively, which, in turn, enables adjustment of color temperature and hue to the requirement of users and achieving the efficacy of adjusting color temperature and hue.

To sum up, the present invention provides a color-mixing LED module. According to the present invention, the red light will not be sheltered or absorbed by green fluorescent powder; the intensity and hue will not be attenuated; and the color rendering and brightness of the light emitted by this structure is superior. The quantity, combination, arrangement (matrix arrangement), and electrical connection of the first and second light-emitting chips can be altered with flexibility according to users' requirements. In addition, the frame 210 can be varied in height, reflectivity, and transmissivity according to requirements. These are quite different from the formal cup design according to the prior art.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A color-mixing light-emitting diode module, comprising:
   a holder;
   a frame member, disposed on said holder, having at least a frame for partitioning into a first accommodating space and two accommodating spaces;
   at least a first light-emitting chip, bonded in said first accommodating space, emitting light with a wavelength between 590 nm to 700 nm, and the light-emitting path of said first light-emitting chip covered by first sealing glue; and
   at least two second light-emitting chips, disposed on one side of said first light-emitting chip, bonded in said plurality of second accommodating spaces, respectively, and the light-emitting path of said second light-emitting chip covered by second sealing glue containing red fluorescent powder;
   where said first light-emitting chip and said plurality of second light-emitting chips are disposed on said holder in a one-to-two matrix.

2. The color-mixing light-emitting diode module of claim 1, wherein said plurality of second light-emitting chips emit ultraviolet light, and said first sealing glue further includes green fluorescent powder and blue fluorescent powder.

3. The color-mixing light-emitting diode module of claim 2, wherein the wavelength of said ultraviolet light ranges between 200 nm and 400 nm.

4. The color-mixing light-emitting diode module of claim 1, wherein said plurality of second light-emitting chips emit blue light, and said second sealing glue further includes green fluorescent powder or yellow fluorescent powder.

5. The color-mixing light-emitting diode module of claim 4, wherein the wavelength of said blue light ranges between 380 nm and 500 nm.

6. The color-mixing light-emitting diode module of claim 1, wherein the electrical connection between said first light-emitting chip and said second light-emitting chip is serial, parallel, or a combination of serial and parallel connections.

7. The color-mixing light-emitting diode module of claim 1, wherein the height of said frame is lower than the height of said frame member; and a sealing layer is further included for covering said first accommodating space, said plurality of second accommodating spaces, and said frame.

8. The color-mixing light-emitting diode module of claim 1, wherein the material of said frame is semi-transparent.

9. A color-mixing light-emitting diode module, comprising:
   a holder;
   a frame member, disposed on said holder, having at least a frame for partitioning into a first accommodating space and a second accommodating space;
   at least a first light-emitting chip, bonded in said frame member, emitting light with a wavelength between 590 nm to 700 nm, and the light-emitting path of said first light-emitting chip covered by first sealing glue; and
   at least a second light-emitting chip, bonded in said frame member, and the light-emitting path of said second light-emitting chip covered by second sealing glue containing red fluorescent powder and green fluorescent powder;
   where the ratio of said red fluorescent powder to said green fluorescent powder ranges between 1:2 and 1:50.

10. The color-mixing light-emitting diode module of claim 9, wherein said second light-emitting chip emits blue light, and the wavelength of said blue light ranges between 380 nm and 500 nm.

11. The color-mixing light-emitting diode module of claim 9, wherein said second light-emitting chip emits ultraviolet light, and said first sealing glue further includes blue fluorescent powder.

12. The color-mixing light-emitting diode module of claim 11, wherein the wavelength of said ultraviolet light ranges between 200 nm and 400 nm.

13. The color-mixing light-emitting diode module of claim 9, where said first light-emitting chip and said second light-emitting chip are arranged on said holder in a one-to-two matrix.

14. The color-mixing light-emitting diode module of claim 9, wherein the electrical connection between said first light-emitting chip and said second light-emitting chip is serial, parallel, or a combination of serial and parallel connections.

15. The color-mixing light-emitting diode module of claim 9, wherein the height of said frame is lower than the height of said frame member; and a sealing layer is further included for covering said first accommodating space, said second accommodating space, and said frame.

16. The color-mixing light-emitting diode module of claim 9, wherein the material of said frame is semi-transparent.

* * * * *